United States Patent
Tajima et al.

(10) Patent No.: US 10,015,915 B2
(45) Date of Patent: Jul. 3, 2018

(54) SHIELD FILM, SHIELDED PRINTED WIRING BOARD, AND METHOD FOR MANUFACTURING SHIELD FILM

(71) Applicant: TATSUTA ELECTRIC WIRE & CABLE CO., LTD., Higashiosaka-shi, Osaka (JP)

(72) Inventors: Hiroshi Tajima, Higashiosaka (JP); Sirou Yamauchi, Higashiosaka (JP); Kenji Kamino, Higashiosaka (JP); Masahiro Watanabe, Higashiosaka (JP)

(73) Assignee: TATSUTA ELECTRIC WIRE & CABLE CO., LTD., Osaka (JP)

( * ) Notice: Subject to any disclaimer, the term of this patent is extended or adjusted under 35 U.S.C. 154(b) by 0 days.

(21) Appl. No.: 14/360,609

(22) PCT Filed: Oct. 12, 2012

(86) PCT No.: PCT/JP2012/076473
§ 371 (c)(1),
(2) Date: May 23, 2014

(87) PCT Pub. No.: WO2013/077108
PCT Pub. Date: May 30, 2013

(65) Prior Publication Data
US 2014/0326484 A1 Nov. 6, 2014

(30) Foreign Application Priority Data
Nov. 24, 2011 (JP) ................................. 2011-256816

(51) Int. Cl.
*H05K 9/00* (2006.01)
*H05K 1/02* (2006.01)
*H05K 3/28* (2006.01)

(52) U.S. Cl.
CPC ............. *H05K 9/00* (2013.01); *H05K 1/0216* (2013.01); *H05K 9/0084* (2013.01);
(Continued)

(58) Field of Classification Search
CPC .................... H05K 2201/0715; H05K 1/0218
(Continued)

(56) References Cited

U.S. PATENT DOCUMENTS 6,210,787 B1    4/2001  Goto et al.
2006/0237133 A1  10/2006  Akamatsu et al.
(Continued)

FOREIGN PATENT DOCUMENTS

CN    1697589 A    11/2005
CN    101331814 A   12/2008
(Continued)

OTHER PUBLICATIONS

Third-Party Observation submitted in connection with corresponding PCT Application PCT/JP2012/076473.
(Continued)

*Primary Examiner* — Hung V Ngo
(74) *Attorney, Agent, or Firm* — Potomac Law Group, PLLC; Kenneth Fagin

(57) ABSTRACT

To provide a shield film which is capable of suitably shielding electric field waves, magnetic field waves, and electromagnetic waves progressing from one side to the other side of the shield film and has good transmission characteristics, a shielded printed wiring board, and a method for manufacturing the shield film, a metal layer 3 which is 0.5 µm to 12 µm thick and an anisotropic conductive adhesive layer 4 which is anisotropic so as to be electrically conductive only in thickness directions are provided in a deposited manner, so that electric field waves, magnetic field waves, and electromagnetic waves progress-
(Continued)

ing from one side to the other side of the shield film are suitably shielded.

13 Claims, 10 Drawing Sheets

(52) U.S. Cl.
CPC ............. *H05K 9/0088* (2013.01); *H05K 3/28* (2013.01); *H05K 2201/0715* (2013.01); *Y10T 29/49226* (2015.01)

(58) Field of Classification Search
USPC .................................................. 174/382, 384
See application file for complete search history.

(56) References Cited

U.S. PATENT DOCUMENTS

| | | | |
|---|---|---|---|
| 2007/0252771 A1 | 11/2007 | Maezawa et al. | |
| 2009/0000804 A1 | 1/2009 | Kobayashi et al. | |
| 2009/0038839 A1* | 2/2009 | Hashimoto | H05K 1/0218 174/350 |
| 2011/0100673 A1 | 5/2011 | Takamatsu et al. | |
| 2012/0048603 A1* | 3/2012 | Huang | H05K 1/0218 174/257 |
| 2013/0033837 A1 | 2/2013 | Ito et al. | |
| 2013/0068521 A1* | 3/2013 | Hong et al. | 174/388 |
| 2016/0205817 A1 | 7/2016 | Tajima et al. | |

FOREIGN PATENT DOCUMENTS

| | | |
|---|---|---|
| CN | 101772996 A | 7/2010 |
| CN | 203225988 U | 10/2013 |
| JP | H8-125380 A | 5/1996 |
| JP | 2000013089 | 1/2000 |
| JP | 2000059075 | 2/2000 |
| JP | 2003188574 | 7/2003 |
| JP | 2004-179381 | 6/2004 |
| JP | 2005-277262 | 10/2005 |
| JP | 2005276873 | 10/2005 |
| JP | 2006-229157 | 8/2006 |
| JP | 2006303067 | 11/2006 |
| JP | 2007-193999 | 8/2007 |
| JP | 2007-294918 | 11/2007 |
| JP | 2007294918 | 11/2007 |
| JP | 2008-120081 | 5/2008 |
| JP | 2008120081 | 5/2008 |
| JP | 2008300881 | 12/2008 |
| JP | 2009-038278 | 2/2009 |
| JP | 2009-206188 | 9/2009 |
| JP | 2009200113 | 9/2009 |
| JP | 2009206188 | 9/2009 |
| JP | 2009246121 | 10/2009 |
| JP | 2009-290103 | 12/2009 |
| JP | 2010108779 | 5/2010 |
| JP | 2011-066329 | 3/2011 |
| TW | 200628062 | 8/2006 |
| TW | 200803664 A | 1/2008 |
| WO | WO 2009/019963 | 2/2009 |
| WO | WO2009019963 | 2/2009 |
| WO | WO2013/077108 | 5/2013 |

OTHER PUBLICATIONS

Request in connection with corresponding PCT Application PCT/JP2012/076473.
PCT Notice re Priority Document in connection with corresponding PCT Application PCT/JP2012/076473.
First and Second PCT Notices re Communication of the International Application in connection with corresponding PCT Application PCT/JP2012/076473.
International Search Report in connection with corresponding PCT Application PCT/JP2012/076473.
Translatoin of International Search Report in connection with corresponding PCT Application PCT/JP2012/076473.
Feb. 24, 2015 Office Action issued in connection with corresponding Japanese application 2013-545845.
Office Action dated Aug. 5, 2014 issued in connection with counterpart Japanese patent application No. 2013-545845.
Notification of submission of information in corresponding JP application 2013-545845.
Explanation of submitted information in corresponding JP application 2013-545845.
Office Action dated Aug. 25, 2015 issued in connection with corresponding Japanese Patent Application No. 2013-545845.
Notification of submission of information in corresponding JP application 2014-256256.
Explanation of submitted information in corresponding JP application 2014-256256.
Submission of Information in Japanese Patent App. No. 2013-545845, May 26, 2015.
Notification of Filing of Documents in re corresponding Japanese patent application No. 2014-256256.
Office Action dated Oct. 4, 2016 in connection with JP 2015-208837.
Office Action dated Oct. 4, 2016 in connection with JP 2015-208838.
Notification of Filing of Documents issed in connection with corresponding application JP 2015-208837.
Office Action dated Aug. 19, 2016 issed in connection with corresponding Chinese application 201210443949.X.
Office Action dated Jul. 26, 2016 in corresponding Japanese Patent Application No. 2014-256256.
Office Action dated Nov. 14, 2016 in connection with corresponding Taiwanese application No. 101138571.
Office Action dated Jan. 10, 2017 in connection with corresponding Japanese application No. 2014-256256.
Office Action dated Jun. 2, 2017 in the corresponding Chinese Patent Application No. 201210443949.X.
Notification of Filing of Documents dated Apr. 4, 2017 in connection with corresponding Japanese patent application No. 2015-208837.
Toshiba Review, vol. 63, No. 5.
Notification of Filing of Documents dated Apr. 11, 2017 in connection with corresponding Japanese patent application No. 2014-256256.
Notification of Information Offer for Japanese Patent Application No. 2015-208837.
Information Offer for Japanese Patent Application No. 2015-208837.

* cited by examiner

SHIELD FILM, SHIELDED PRINTED WIRING BOARD, AND METHOD FOR MANUFACTURING SHIELD FILM

CROSS-REFERENCE TO RELATED APPLICATIONS

This is the U.S. National Stage of PCT application number PCT/JP2012/076473 filed Oct. 12, 2012. The PCT application was based on and claims priority to underlying Japanese priority application number JP 2011-256816 filed Nov. 24, 2011, the contents of which are incorporated herein by reference.

TECHNICAL FIELD

The present invention relates to a shield film used in an apparatus such as a mobile apparatus, a shielded printed wiring board using the shield film, and a method for manufacturing the shield film.

BACKGROUND ART

A shield film for shielding noise such as electromagnetic noise has been publicly known. For example, PTL 1 and 2 recite a shield film for a printed wiring board, in which a metal layer and an adhesive layer are serially deposited.

CITATION LIST

Patent Literature

PTL 1
Japanese Unexamined Patent Publication No. 2005-276873
PTL 2
Japanese Unexamined Patent Publication No. 2009-246121

SUMMARY OF INVENTION

Technical Problem

Mobile apparatuses represented by smart phones have become multi-functional. For example, large-capacity signal processing is required to achieve not only the Internet connection but also the reproduction of high-definition images, high-quality images, and three-dimensional images and the processing acceleration. To process such large-capacity signals, the signal processing is accelerated and the noise reduction in signal lines and good transmission characteristics of signals are required. For this reason, a flexible printed wiring board having better shielding characteristics and transmission characteristics has been demanded.

To solve the problem above, an object of the present invention is to provide a shield film which is capable of suitably shielding electric field waves, magnetic field waves, and electromagnetic waves progressing from one side to the other side of the shield film and has good transmission characteristics, a shielded printed wiring board, and a method for manufacturing the shield film.

Solution to Problem

The present inventors diligently made extensive studies to achieve the object above and found that good shielding characteristics and transmission characteristics were achieved by arranging a metal layer to have a thickness of 0.5 μm to 12 μm and using an anisotropic conductive adhesive for an adhesive layer.

That is to say, in the present invention, a metal layer which is 0.5 μm to 12 μm thick and an anisotropic conductive adhesive layer, which are in a deposited state.

According to the arrangement above, because of the presence of the metal layer 0.5 μm to 12 μm thick, electric field waves, magnetic field waves, and electromagnetic waves progressing from one side to the other side of the shield film are suitably shielded. Furthermore, because the conductive adhesive layer is an anisotropic conductive adhesive layer, the transmission characteristics are better than those in case of a isotropic conductive adhesive layer.

In the shield film of the present invention, the metal layer is metal foil.

According to the arrangement above, a metal layer with a desired thickness is easily obtained and better shielding characteristics are achieved as compared to a case where a thin-film metal layer is formed by vapor deposition.

In the shield film of the present invention, the metal foil is formed by rolling.

According to this arrangement, on account of good shape retaining property, the workability when assembling a flexible substrate or the like with which the shield film is bonded is improved.

In the shield film of the present invention, the thickness of the metal foil is adjusted by etching.

According to this arrangement, after the metal foil is processed to have a thickness in the first size, the metal foil is etched to be as thin as the second size. With this, it is possible to obtain a highly precisely thin metal layer which cannot be processed by rolling.

In the shield film of the present invention, the metal foil is mainly made of copper.

According to the arrangement above, it is possible to obtain a shield film having good workability on account of the good shape retaining property, at low cost.

The shield film of the present invention may be arranged such that, a protective metal layer is provided between a metal layer which is the metal foil mainly made of copper and the anisotropic conductive adhesive layer.

According to the arrangement above, the oxidization of the metal layer is restrained and the increase in the surface resistance of the metal layer is restrained, with the result that the shielding effect is stably exerted.

The shield film of the present invention may be arranged such that the metal layer is formed by an additive process. This arrangement makes it possible to finely adjust the thickness of the metal layer when forming the metal layer.

The shield film of the present invention may be arranged such that, as the additive process, the metal layer is formed by at least one of electroplating and electroless plating.

This arrangement makes it possible to finely adjust the thickness of the metal layer when forming the metal layer and to improve the production efficiency.

In the shield film of the present invention, the shield film is used as an electromagnetic waves shield film of a signal transmission system transmitting a signal with a frequency of 10 MHz to 10 GHz.

This makes it possible to provide a shield film which is suitable for high-speed transmission but is low cost.

A shielded printed wiring board of the present invention includes: a printed wiring board including a base member in which a printed circuit is formed and an insulating film provided on the base member so as to cover the printed circuit; and the above-described shield film provided on the printed wiring board.

In the shielded printed wiring board of the present invention, the printed circuit includes a ground wiring pattern.

A method for manufacturing shield film of the present invention includes the steps of: after forming metal foil with a predetermined thickness by rolling, etching the metal foil to have a predetermined thickness falling within the range of 0.5 µm to 12 µm; and forming an anisotropic conductive adhesive layer on one side of the metal layer.

BRIEF DESCRIPTION OF DRAWINGS

FIG. 3 shows the structure of a system used in a KEC method.

DESCRIPTION OF EMBODIMENTS

The following will describe a preferred embodiment of the present invention with reference to figures.

(Structure of Shield Film 1)

Figure 1:
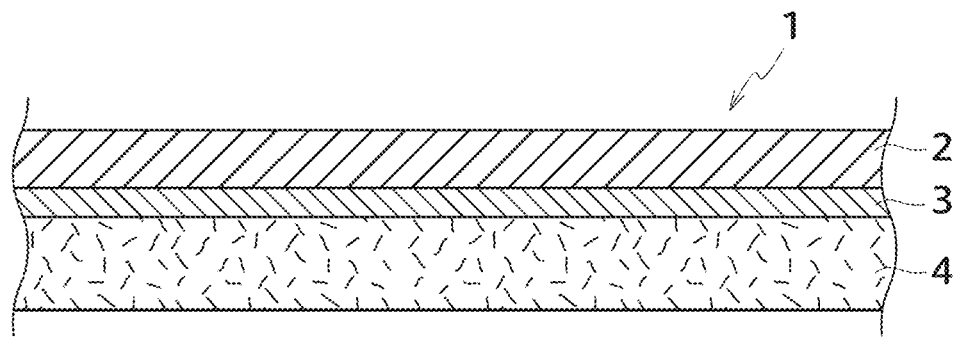
FIG. 1 is a cross section of a shield film.

A shield film 1 shown in FIG. 1 is structured in such a way that a metal layer 3 which is 0.5 µm to 12 µm thick and an anisotropic conductive adhesive layer 4 are provided in this order on one surface of an insulating layer 2. In other words, in the shield film 1, the metal layer 3 and the anisotropic conductive adhesive layer 4 are deposited.

(Insulating Layer 2)

The insulating layer 2 is constituted by layers such as a cover film and a coating layer made of insulating resin.

The cover film is made of engineering plastics. Examples of the engineering plastics include polypropylene, cross-linked polyethylene, polyester, polybenzimidazole, aramid, polyimide, polyimidoamide, polyetherimide, polyphenylene sulfide (PPS), and polyethylene naphthalate (PEN).

A low-cost polyester film is preferred when the required degree of heat resistance is not high. A polyphenylene sulfide film is preferred when flame retardance is required. An aramid film or a polyimide film is preferred when good heat resistance is required.

The insulating resin is of any type as long as electric insulation is achieved. Examples of the insulating resin includes thermosetting resin and ultraviolet curing resin. Examples of the thermosetting resin include phenol resin, acrylic resin, epoxy resin, melamine resin, silicon resin, and acryl-denatured silicon resin. Examples of the ultraviolet curing resin include epoxy acrylate resin, polyester acrylate resin, and methacrylate modification thereof. The curing is of any type, e.g., thermosetting, ultraviolet curing, and electron beam curing.

When the shield film 1 is employed in a flexible printed wiring board, the lower limit of the thickness of the insulating layer 2 is preferably 1 µm, more preferably 3 µm. The upper limit of the thickness of the insulating layer 2 is preferably 10 µm, more preferably 7 µm.

The metal layer 3 is 0.5 µm to 12 µm thick. This makes it possible to suitably shield electric field waves, magnetic field waves, and electromagnetic waves progressing from one side to the other side of the shield film, and such shielding property is preferable when the shield film is employed in the flexible printed wiring board.

The metal layer 3 is preferably metal foil. With this, a metal layer with a desired thickness is easily obtained, and the obtained shielding characteristics are better than those of a thin-film metal layer formed by vapor deposition. In addition to the above, the metal layer 3 is preferably formed by rolling. This provides the shield film with a good shape retaining property. The workability when assembling a flexible substrate or the like with which the shield film is bonded is improved. For example, when a flexible printed wiring board including the shield film is bended and attached to a mobile apparatus or the like, the flexible printed wiring board retains the bended state on account of the good shape retaining property of the shield film. The operator is therefore not required to retain the bended state by himself/herself, with the result that the assembling work of the mobile apparatus or the like becomes less burdensome and the workability is improved. In addition to the above, when the metal layer 3 is formed by rolling, the layer thickness is preferably adjusted by etching.

Preferably the metal layer 3 is mainly made of copperas a metal material. With this, good workability and good conductivity are obtained on account of the good shape retaining property, and the shield film is manufactured at low cost. The metal layer 3 is not necessarily made mainly of copper. The layer may be made of any one of nickel, copper, silver, tin, gold, palladium, aluminum, chromium, titanium, and zinc, or an alloy of at least two of them.

The metal layer 3 may not be a metal foil formed by rolling. The layer may be metal foil formed by electrolysis (e.g., special electro-deposited copper foil) or may be formed by vacuum deposition which is an additive process, sputtering, chemical vacuum deposition, metal organic chemical vacuum deposition, or plating.

The plating may be electroplating (plating by electrolysis reaction utilizing electricity through an external electrode or the like) or electroless plating (plating by chemical reaction not utilizing electricity through an external electrode or the like, e.g., displacement plating or chemical plating). In consideration of the production efficiency, preferably the electroplating is performed after the electroless plating as preparation. The electroless plating typically involves troublesome pretreatments such as plating of the plated surface and catalytic reaction. In this regard, to simplify the pretreatments, the layer may be coated with conductive polymer. A preferred but non-limiting example of the conductive polymer is catalyst species such as palladium. The lower limit of the thickness of the metal layer 3 is further preferably 1 μm, even further preferably 2 μm. To improve the sliding characteristic, the upper limit of the thickness of the metal layer 3 is further preferably 6 μm, even further preferably 3 μm.

The anisotropic conductive adhesive layer 4 is an anisotropic conductive adhesive layer which is anisotropic as it is electrically conductive only in the thickness directions. The transmission characteristics of this layer are good as compared to an isotropic conductive adhesive layer which is isotropic as it is electrically conductive in three dimensions, i.e., in all of the thickness directions, the width directions, and the longitudinal directions. The anisotropic conductive adhesive layer 4 is formed by adding a flame retardant and conductive fillers to an adhesive.

When the shield film 1 is employed in a FPC (flexible printed wiring board), the lower limit of the thickness of the anisotropic conductive adhesive layer 4 is preferably 2 μm, more preferably 3 μm. The upper limit of the thickness of the anisotropic conductive adhesive layer 4 is preferably 15 μm, more preferably 3 μm.

The adhesive in the anisotropic conductive adhesive layer 4 is, as adhesive resin, constituted by thermosetting resin such as polystyrene resin, vinyl acetate resin, polyester resin, polyethylene resin, polypropylene resin, polyamide resin, rubber, and acrylic resin, and/or thermosetting resin such as phenol resin, epoxy resin, urethane resin, melamine resin, and alkyd resin. The adhesive may be made sorely of the resin above or a mixture of the above. The adhesive may further include tackifier. Examples of the tackifier include fatty acid hydrocarbon resin, C5/C9 mixed resin, rosin, rosin derivative, terpene resin, aromatic hydrocarbon resin, and thermal reactive resin.

The conductive fillers added to the anisotropic conductive adhesive layer 4 are made of a metal material at least in part. For example, the conductive fillers are copper powder, silver powder, nickel power, silver-coated copper powder (Ag-coated Cu powder), gold-coated copper powder, silver-coated nickel powder (Ag-coated Ni powder), or gold-coated nicked powder. These types of metal powders are formed by atomization, a carbonyl process, or the like. Alternatively, particles formed by coating metal powder with resin or particles formed by coating resin with metal powder may be used as the conductive fillers. To the anisotropic conductive adhesive layer 4, a mixture of more than one type of conductive fillers 1 may be added. The conductive fillers are preferably Ag-coated Cu powder or Ag-coated Ni powder. This is because conductive particles having stable conductivity are obtained at low cost.

The amount of the conductive fillers to be added is 3 wt % to 39 wt % of the entire amount of the anisotropic conductive adhesive layer 4. An average particle size of the conductive fillers preferably falls within the range of 2 μm to 20 μm. An optimal average particle size is chosen in consideration of the thickness of the anisotropic conductive adhesive layer 4. The metal fillers may be spherical, needle-shaped, fibrous, flaky, or arborescent.

(Structure of Shielded Printed Wiring Board 10)

Now, referring to FIG. 2, a shielded printed wiring board 10 in which the above-described shield film 1 is joined with an FPC (flexible printed wiring board) will be described. Note that, although the embodiment deals with a case where the shield film is joined with the FPC, the disclosure is not limited to this arrangement. The shield film may be employed in a COF (Chip-on-Flex), an RF (Rigid Flexible Printed Board), a multilayer flexible board, and a rigid board.

As shown in FIG. 2, the shielded printed wiring board 10 is formed by depositing the above-described shield film 1 on a base film (FPC) 8. The base film 8 is formed by deposing a basic film 5, a printed circuit 6, and an insulating film 7 one by one.

Figure 2A:
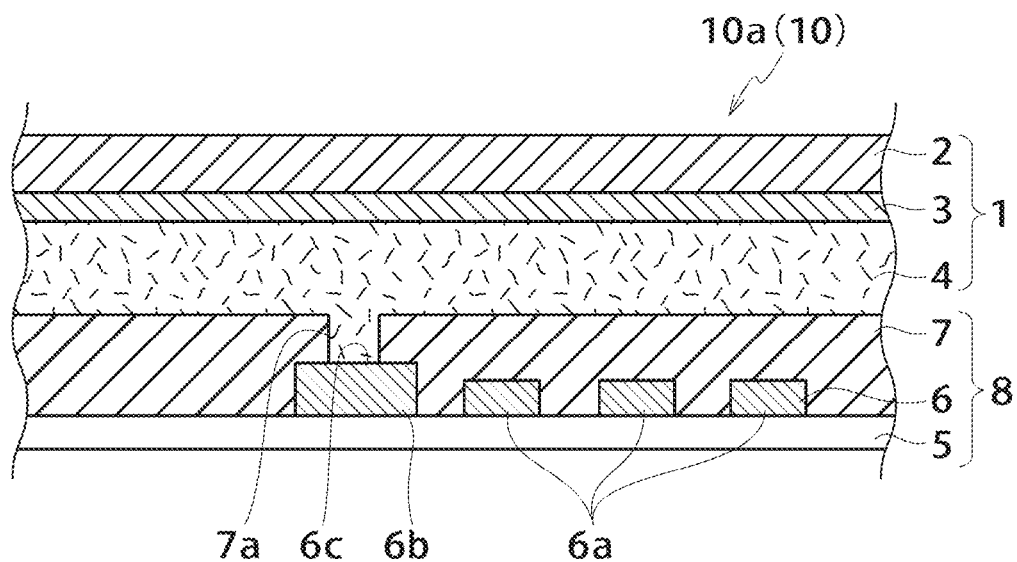
FIG. 2(a) is a cross section of a shielded printed wiring board which includes a signal circuit and a ground circuit in its wiring pattern.

As shown in FIG. 2(a), the surface of the printed circuit 6 is constituted by a signal circuit 6a and a ground circuit 6b. The printed circuit 6 is entirely covered with the insulating film 7 except at least at a part of the ground circuit 6b (non-insulating part 6c). The insulating film 7 includes an insulation removal part 7a filled with apart of the anisotropic conductive adhesive layer 4 of the shield film 1. This allows the ground circuit 6b to be electrically connected to the metal layer 3.

Figure 2B:
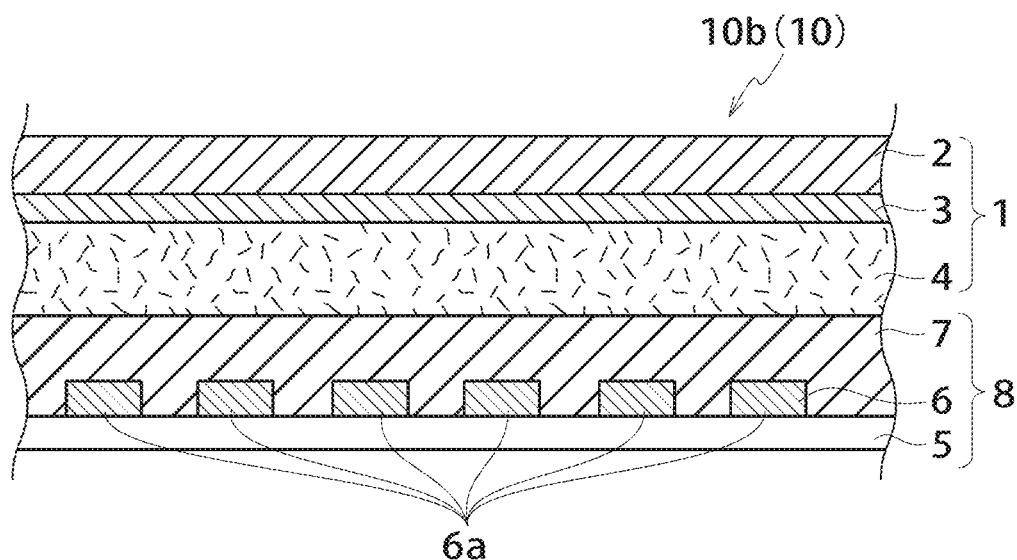
FIG. 2(b) is a cross section of a shielded printed wiring board which includes only a signal circuit in its wiring pattern.

The wiring patterns of the signal circuit 6a and the ground circuit 6b are formed by etching a conductive material. The ground circuit 6b indicates a pattern retaining a ground potential. In other words, a ground circuit 6b which is a wiring pattern for grounding is formed in the basic film 5. Alternatively, as shown in FIG. 2(b), the printed circuit 6 may not include the ground circuit 6b. In such a case, the printed circuit 6 is entirely covered with the insulating film 7.

In the present embodiment, a signal with a frequency of 10 MHz to 10 GHz is supplied to the signal circuit 6a. To put it differently, the shield film 1 is preferably but not necessarily used as a shield film for a signal transmission system by which a signal with a frequency of 10 MHz to 10 GHz is transmitted.

The lower limit of the frequency of the signal transmission system for which the shield film 1 is used is preferably 10 MHz, more preferably 100 MHz. The upper limit of the frequency of the signal transmission system for which the shield film 1 is used is preferably 10 GHz, more preferably 5 GHz.

The basic film 5 may be joined with the printed circuit 6 using an adhesive, or they may be joined with each other without using an adhesive, e.g., in a similar manner as so-called adhesive-free copper-clad laminated sheets. In addition to the above, the insulating film 7 may be a flexible insulating film joined using an adhesive, or may be formed by a series of processes such as application of photosensitive insulating resin, drying, exposure, development, and thermal treatment. When the insulating film 7 is joined using an adhesive, an insulation removal part 7a is formed also at a part of the adhesive corresponding to the ground circuit 6b. Furthermore, the base film 8 is suitably selected from a one-sided FPC in which a printed circuit is provided only on one side of a basic film, a double-sided FPC in which printed circuits are provided on the both sides of a basic film, a multilayer FPC in which these types of FPCs are laminated, a Flexboard (registered trademark) including a multilayer mounting portion and a cable portion, a flexible rigid board in which members forming a multilayer portion are hard, and a TAB tape for tape carrier package.

Both of the basic film 5 and the insulating film 7 are made of engineering plastics. Examples of the engineering plastics include resins such as polyethylene terephthalate, polypropylene, cross-linked polyethylene, polyester, polybenzimidazole, polyimide, polyimidoamide, polyetherimide, and polyphenylene sulfide (PPS). A low-cost polyester film is preferred when the required degree of heat resistance is not high. A polyphenylene sulfide film is preferred when flame retardance is required. A polyimide film is preferred when good heat resistance is required.

The lower limit of the thickness of the basic film 5 is preferably 10 µm, more preferably 20 µm. The upper limit of the thickness of the basic film 5 is preferably 60 µm, more preferably 40 µm.

The lower limit of the thickness of the insulating film 7 is preferably 10 µm, more preferably 20 µm. The upper limit of the insulating film 7 is preferably 60 µm, more preferably 40 µm.

(Manufacturing Method of Shield Film 1)

A method of manufacturing the shield film 1 of the present embodiment will be described.

To begin with, copper is rolled by inserting the copper into the space between rotating rollers, until the thickness becomes a first size. The lower limit of this thickness in the first size is preferably 3 µm, more preferably 6 µm, further preferably 3 µm. The upper limit of the thickness in the first size is preferably 35 µm, more preferably 18 µm, and further preferably 12 µm.

The copper foil rolled to have the thickness in the first size is etched to be as thick as the second size (0.5 µm to 12 µm), so that a metal layer 3 is formed. More specifically, the copper foil which is 6 µm thick is immersed in etchant made up of sulfuric acid and hydrogen peroxide to be 2 µm thick. Note that, the adhesion of the etched copper foil surface is preferably improved by plasma treatment.

Furthermore, a surface of the metal layer 3 is coated with the anisotropic conductive adhesive layer 4. With the other surface of the metal layer 3, an insulating layer 2 which is a protective film is joined. The step of forming the insulating layer may be omitted.

(Method of Manufacturing Shielded Printed Wiring Board 10)

To begin with, an insulation removal part 7a is formed in the insulating film 7 of the base film 8 by boring a hole in the film 7 by laser or the like. AS a result, a part of the ground circuit 6b is exposed to the outside at the insulation removal part 7a.

Subsequently, a shield film 1 is joined with the insulating film 7 of the base film 8. This joining is carried out in such a way that, while the shield film 1 is being heated by a heater, the printed wiring board 10 and the shield film 1 are pressed against each other in vertical directions by a pressing machine. As the anisotropic conductive adhesive layer 4 of the shield film 1 is softened by the heat of the heater, the shield film 1 is joined with the insulating film 7 on account of the pressure of the pressing machine. At the same time, a part of the softened anisotropic conductive adhesive layer 4 fills the insulation removal part 7a. As a result, the part of the ground circuit 6b exposed at the insulation removal part 7a is joined with the anisotropic conductive adhesive layer 4. The ground circuit 6b and the metal layer 3 therefore become electrically connected with each other through the anisotropic conductive adhesive layer 4.

The embodiment of the present invention has been described above. It is noted that the present invention is not necessarily limited to the embodiment above.

For example, the shield film 1 may not be attached to one side of the shielded printed wiring board 10 of the present embodiment. For example, shield films may be attached to both sides.

In the shielded printed wiring board 10 of the present embodiment, when the metal material of which the metal layer 3 is mainly made is copper, the surface of the metal layer 3 may be oxidized and the surface resistance may be increased, due to reasons in manufacturing conditions or manufacturing steps. When the surface resistance is increased in this way, the connection resistance between the anisotropic conductive adhesive layer 4 and the ground circuit 6b is also increased, with the result that the shielding effect of the shield film 1 may be deteriorated.

Figure 11:
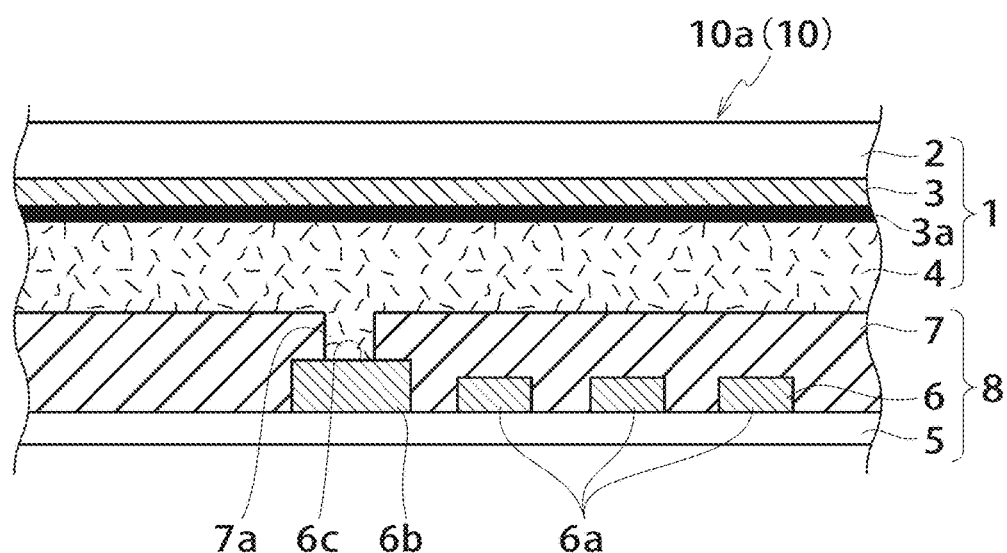
FIG. 11 is a cross section of a shielded printed wiring board including a shield film having a protective metal layer.

In consideration of this, as shown in FIG. 11, a protective metal layer 3a having low surface resistance and low connection resistance may be provided between the metal layer 3 and the anisotropic conductive adhesive layer 4. This protective metal layer 3a is preferably made of silver (Ag) or gold (Au). The protective metal layer 3a may be formed by vacuum deposition which is an additive process, sputtering, chemical vacuum deposition, metal organic chemical vacuum deposition, or plating, in the same manner as the metal layer 3.

As such, on account of the protective metal layer 3a provided between the metal layer 3 and the anisotropic conductive adhesive layer 4, the oxidization of the metal layer 3 is restrained and the increase in the surface resistance of the metal layer 3 is restrained, with the result that the shielding effect is stably exerted.

The above embodiment thus described solely serves as a specific example of the present invention, and the present invention is not limited to such an example. Specific structures of various means and the like may be suitably designed or modified. Further, the effects of the present invention described in the above embodiment are not more than examples of most preferable effects achievable by the present invention. The effects of the present invention are not limited to those described in the embodiments described above.

EXAMPLES

Now, the present invention will be explained in a specific manner, with reference to Examples 1 to 5 and Comparative Examples 1 and 2 of the shield film of the present embodiment. In Examples 1 to 5 and Comparative Examples 1 and 2, a shield film (measurement sample) 101 shown in Table 1 was used. Table 1 shows a manufacturing methods and materials of the metal layer and whether the adhesive layer is an anisotropic conductive adhesive or an isotropic conductive adhesive.

TABLE 1

| | | EXAMPLE | | | | | COMPARATIVE EXAMPLE | |
|---|---|---|---|---|---|---|---|---|
| TYPE | ITEM | EXAMPLE 1 | EXAMPLE 2 | EXAMPLE 3 | EXAMPLE 4 | EXAMPLE 5 | COMPARATIVE EXAMPLE 1 | COMPARATIVE EXAMPLE 2 |
| ARRANGEMENT | INSULATING LAYER(µm) | 5 | 5 | 5 | 5 | 5 | 5 | 5 |
| | TYPE AND THICKNESS OF METAL LAYER(µm) | ROLLED COPPER FOIL 0.5 | ROLLED COPPER FOIL 1 | ROLLED COPPER FOIL 2 | ROLLED COPPER FOIL 3 | ROLLED COPPER FOIL 6 | Ag DEPOSITION 0.1 | ROLLED COPPER FOIL 6 |

TABLE 1-continued

| TYPE | ITEM | EXAMPLE | | | | | COMPARATIVE EXAMPLE | |
|------|------|---------|---|---|---|---|---------------------|---|
|      |      | EXAMPLE 1 | EXAMPLE 2 | EXAMPLE 3 | EXAMPLE 4 | EXAMPLE 5 | COMPARATIVE EXAMPLE 1 | COMPARATIVE EXAMPLE 2 |
|      | TYPE AND THICKNESS OF CONDUCTIVE ADHESIVE LAYER(μm) | ANISO-TROPIC 9 | ANISO-TROPIC 9 | ANISO-TROPIC 9 | ANISO-TROPIC 9 | ANISO-TROPIC 9 | ANISO-TROPIC 9 | ISO-TROPIC 9 |

<Electric Field Waves and Magnetic Field Wave Shielding Characteristics>

To begin with, the electric field wave and magnetic field wave shielding characteristics of the shield film were evaluated by the KEC method using an electromagnetic wave shielding effect measuring apparatus 11 (electric field wave shielding effect evaluator 11a and magnetic field wave shielding effect evaluator 11b) developed by KEC Electronic Industry Development Center. FIG. 3 shows the structure of a system used in the KEC method. The system used in the KEC method is constituted by the electromagnetic wave shielding effect measuring apparatus 11, a spectrum analyzer 21, an attenuator 22 for attenuation by 10 dB, an attenuator 23 for attenuation by 3 dB, and a pre-amplifier 24.

As the spectrum analyzer 21, U3741 made by ADVANTEST CORPORATION was used. Furthermore, HP8447F made by Agilent Technologies was used.

Figure 3A:
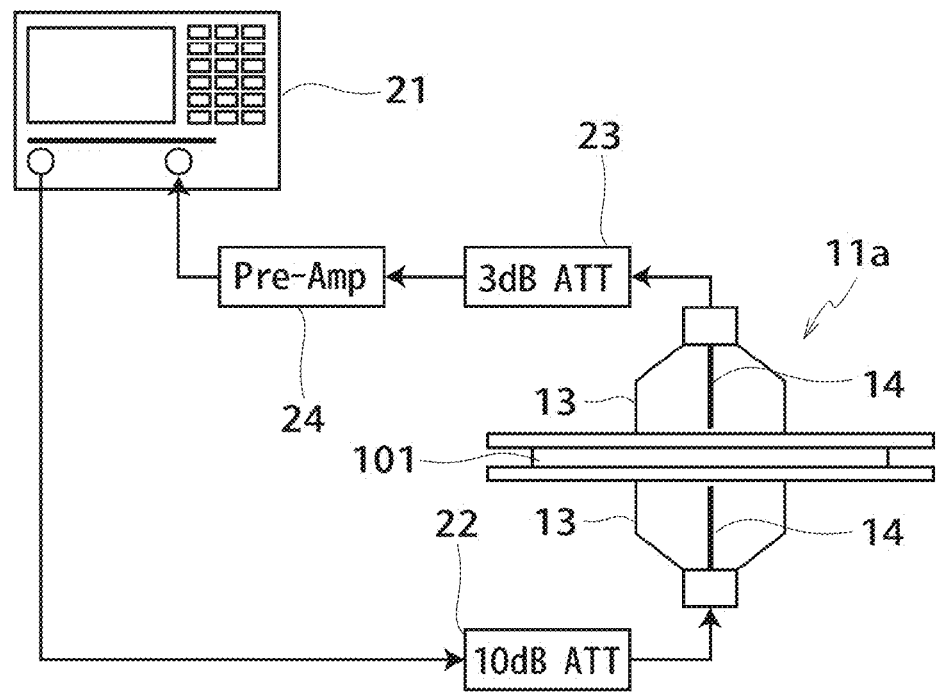
FIG. 3(a) shows an electric field wave shielding effect evaluator.
Figure 3B:
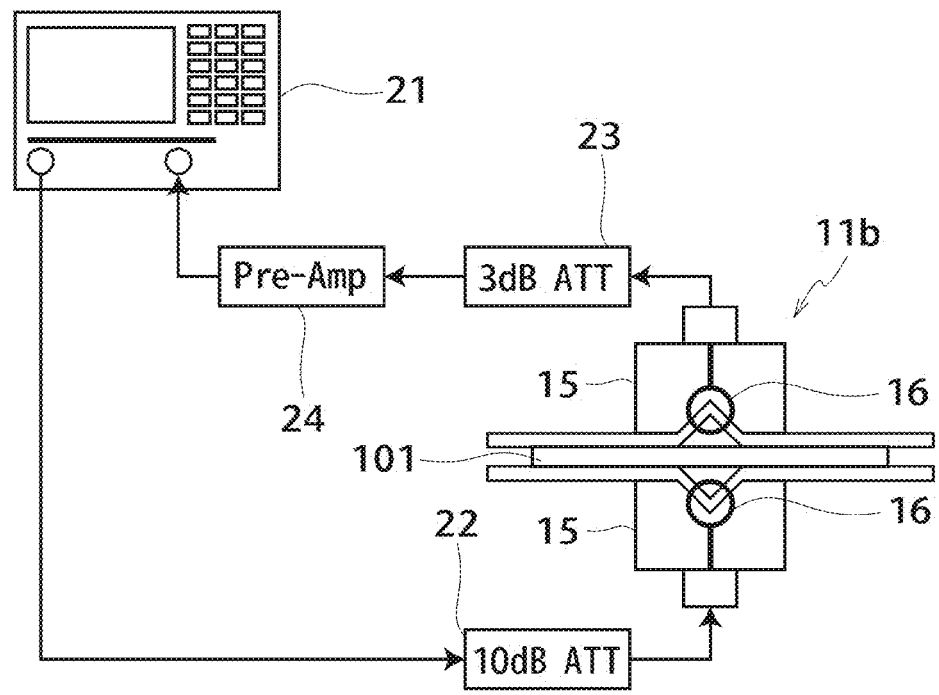
FIG. 3(b) shows a magnetic field wave shielding effect evaluator.

As shown in FIG. 3, a jig for measuring the electric field wave shielding characteristics is different from a jig for measuring the magnetic field wave shielding characteristics (measuring jigs 13 and 15). FIG. 3(a) shows the electric field wave shielding effect evaluator 11a whereas FIG. 3(b) shows the magnetic field wave shielding effect evaluator 11b. In the electric field wave shielding effect evaluator 11a, two measuring jigs 13 are provided to oppose each other. Between these measuring jigs 13, a shield film (measurement sample) 101 which is the measurement target shown in Table 1 is provided. Each measuring jig 13 is sized in accordance with the TEM cell (Transverse ElectroMagnetic Cell), and is symmetrical about a plane which is orthogonal to the transmission axis thereof. However, to prevent the occurrence of short-circuit as a result of the insertion of the measurement sample 101, a planer central conductor 14 is spaced from each measuring jig 13.

In the electric field wave shielding effect evaluator 11a, two measuring jigs 15 are provided to oppose each other. Between these measuring jigs 15, the shield film 101 which is the measurement target is provided. To generate an electromagnetic field with a large magnetic field wave component, the wave shielding effect evaluator 11b is structured such that a shield-type circular loop antenna 16 is used as the measuring jig 15, and a quarter of the loop antenna juts to the outside in combination with a metal plate with an angle of 90 degrees.

The shield films 101 in Example 3, Example 5, and Comparative Example 1 shown in Table 1 for the measurement were sized 15 centimeters square. The measurement was done in the frequency range of 1 MHz to 1 GHz. Furthermore, the measurement was done at a temperature of 25 degrees centigrade and in the relative moisture of 30 to 50 percent.

In the KEC method, to begin with, a signal output from the spectrum analyzer 21 is input to the measuring jig 13 or the measuring jig 15 on the sender side, via the attenuator 22. After received by the measuring jig 13 or the measuring jig 15 on the receiver side and passing through the attenuator 23, the signal is amplified by the pre-amplifier 24, and the signal level is measured by the spectrum analyzer 21. The spectrum analyzer 21 outputs an attenuation amount when the shield film is provided in the electromagnetic wave shielding effect measuring apparatus 11, on the basis of the state in which the shield film is not provided in the electromagnetic wave shielding effect measuring apparatus 11.

Figure 4A:
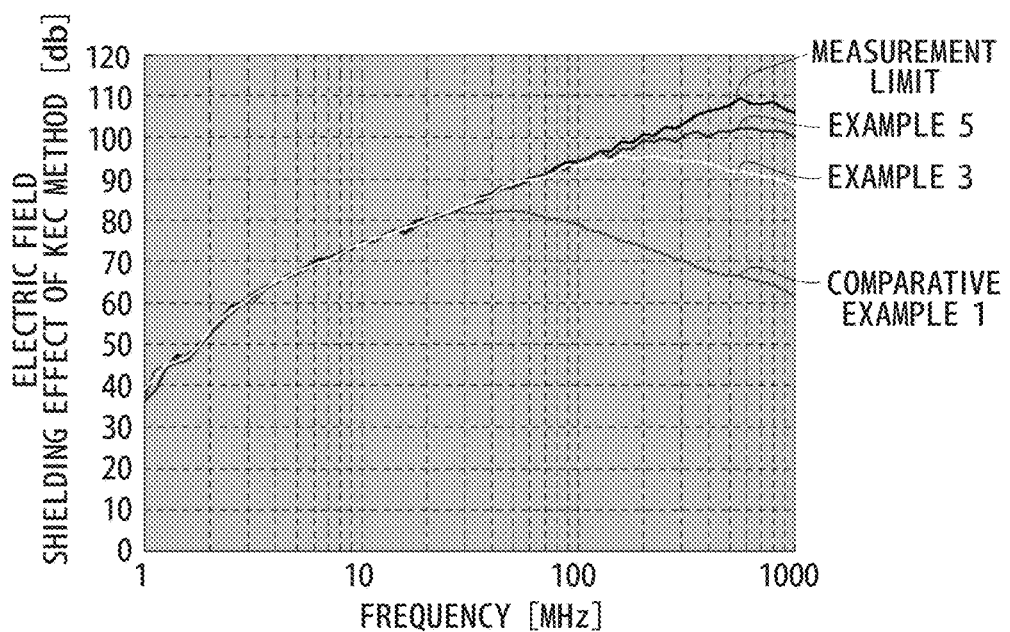
FIG. 4 (a) shows results of measurement of the electric field wave shielding capability by the KEC method.
FIG. 4(b) shows a result of measurement of the magnetic field wave shielding capability by the KEC method.
Figure 4B:
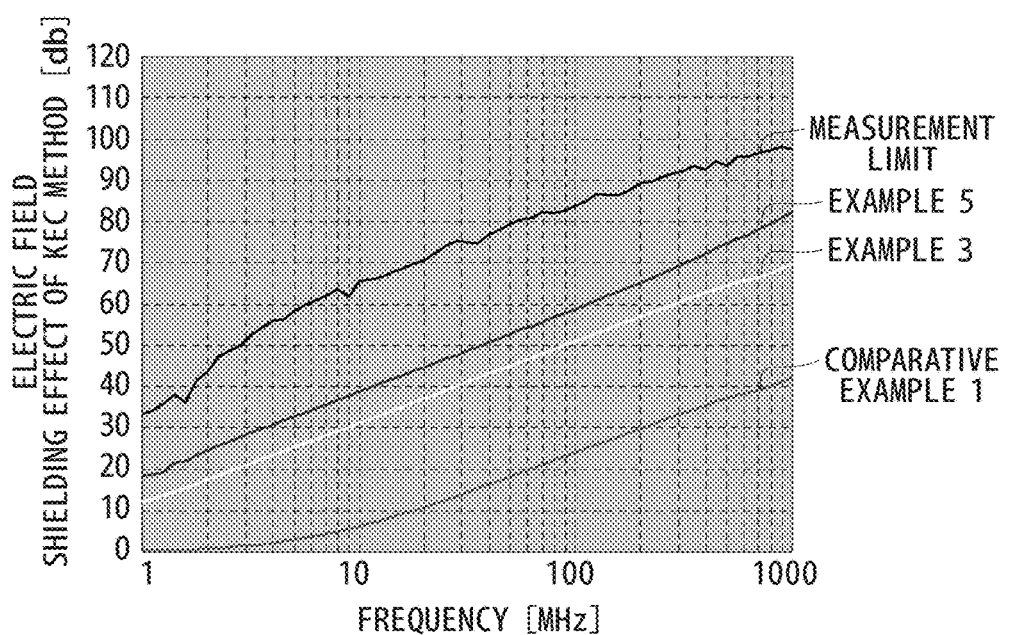

Measurement results of the electric field wave shielding capability according to the KEC method are shown in FIG. 4(a), and measurement results of the magnetic field wave shielding capability according to the KEC method are shown in FIG. 4(b). According to the results, the attenuation amounts are large in Examples 3 and 5 as compared to Comparative Example 1, indicating that they are effective in terms of the shielding characteristics.

<Frequency Characteristics>

Figure 5:
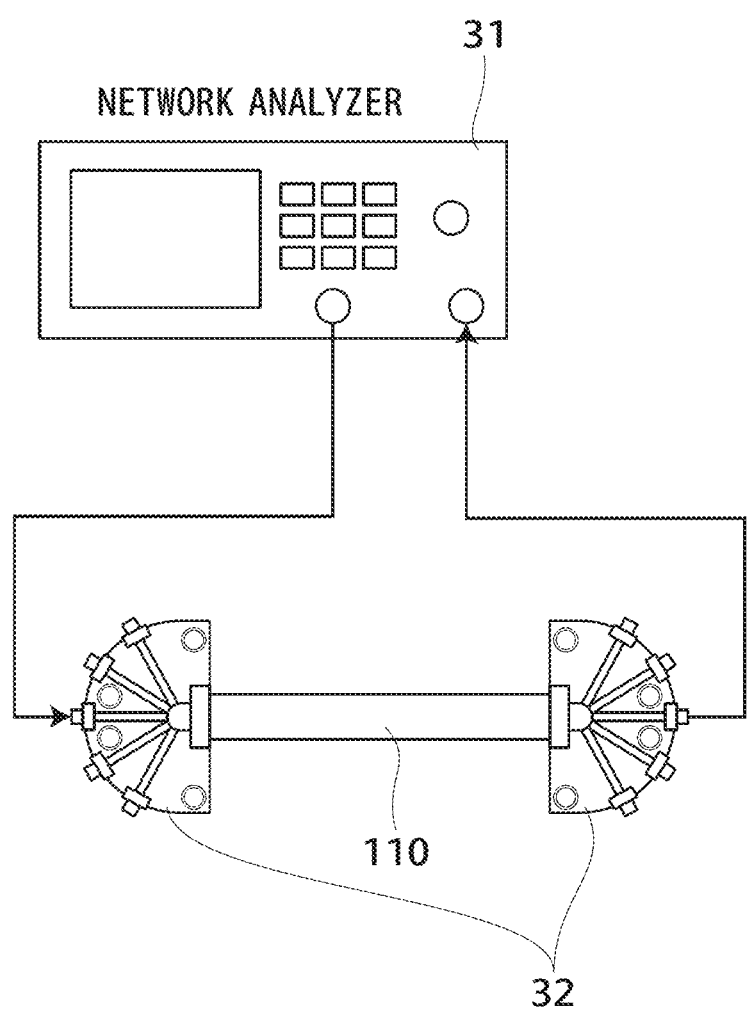
FIG. 5 is a system configuration diagram of a system for measuring frequency characteristics.

The frequency characteristics of the shield film were evaluated using a network analyzer 31 shown in FIG. 5. As the network analyzer 31, ZVL6 made by Rohde & Schwarz was used. The network analyzer 31 includes an input terminal and an output terminal, and connection boards 32 are connected to the respective terminals. Between the pair of connection boards 32, a shield flexible printed wiring board 110 which is the measurement target is connected so as to linearly float in the air. The measurement was done in this state.

A measurement target (shield flexible printed wiring board 110a) was manufactured in such a way that a shield flexible printed wiring board 110 in which the printed circuit included no ground circuit (hereinafter, one-sided shielding) as shown in FIG. 2(b) was manufactured from each of the shield films 101 of Example 5, Comparative Example 1, and Comparative Example 2 shown in Table 1. Another measurement target (shield flexible printed wiring board 110b) was manufactured by attaching the shield film 101 onto the basic film side of the shield flexible printed wiring board 110a (hereinafter, double-sided shielding). In these shield flexible printed wiring boards 110, an insulating film which was 37.5 μm thick and was formed by joining a polyimide film 12.5 μm thick with an adhesive layer 25 μm thick was used. The circuit pattern was formed by conducting 6 μm-copper plating on copper foil 12 μm thick. As described above, the circuit pattern does not include a ground circuit. As the basic film, a polyimide film 25 μm thick was used. The shield flexible printed wiring board 110 was 200 mm in length. The measurement was done in the frequency range of 100 kHz to 6 GHz. Furthermore, the measurement was done at a temperature of 25 degrees centigrade and in a relative moisture of 30 to 50 percent.

Figure 6A:
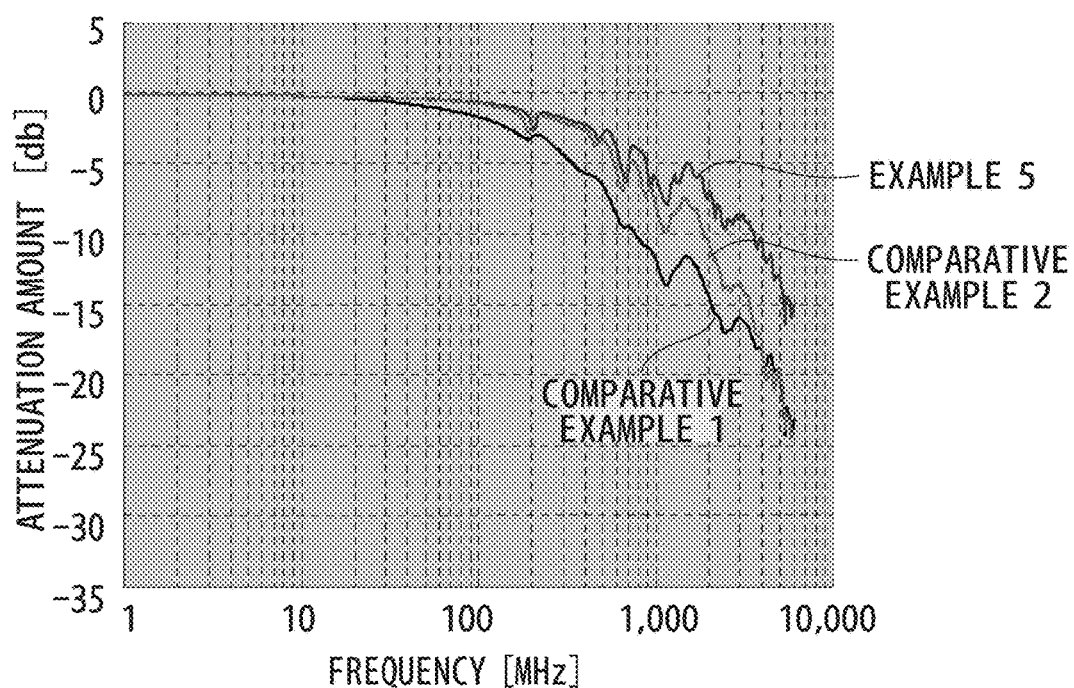
FIG. 6(a) shows results of measurement of the frequency characteristics in case of one-sided shielding.
Figure 6B:
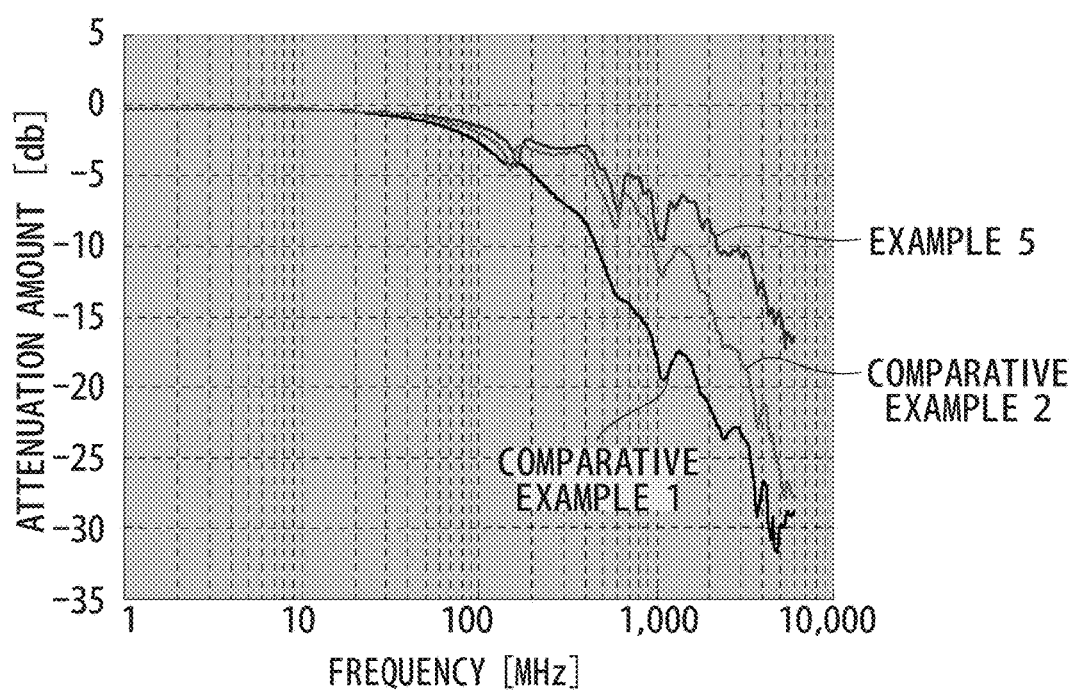
FIG. 6(b) shows results of measurement of the frequency characteristics in case of double-sided shielding.

The network analyzer 31 measures, for each frequency, to what extent an output signal is attenuated as compared to an input signal. Measurement results of one-sided shielding by the network analyzer 31 are shown in FIG. 6(a), whereas measurement results of double-sided shielding by the network analyzer 31 are shown in FIG. 6(b). According to the results, both in the one-sided shielding and in the double-sided shielding, the attenuation amount in Example 5 was small as compared to Comparative Examples 1 and 2, indicating that it had good transmission characteristics.

In regard to FIG. 6(a) and FIG. 6(b), attenuation amounts at typical frequencies in Comparative Examples 1 and 2 and Example 5 are shown in Table 2.

TABLE 2

| SHIELD FILM | SHIELDING METHOD | FREQUENCY (MHz) | | | | |
|---|---|---|---|---|---|---|
| | | 10 | 30 | 100 | 1000 | 6000 |
| COMPARATIVE EXAMPLE 1 | ONE-SIDED SHIELDING | −0.32 | −0.68 | −1.81 | −11.95 | −23.12 |
| COMPARATIVE EXAMPLE 2 | | −0.31 | −0.43 | −0.84 | −8.23 | −23.81 |
| EXAMPLE 5 | | −0.31 | −0.42 | −0.75 | −6.17 | −14.93 |
| COMPARATIVE EXAMPLE 1 | DOUBLE-SIDED SHIELDING | −0.30 | −0.72 | −2.75 | −17.96 | −28.78 |
| COMPARATIVE EXAMPLE 2 | | −0.35 | −0.57 | −2.01 | −11.13 | −27.77 |
| EXAMPLE 5 | | −0.35 | −0.52 | −1.55 | −9.12 | −16.33 |

(UNIT: dB)

According to the measurement results in Table 2, around 30 MHz exceeding 10 MHz, a difference in the attenuation amounts is observed between cases where the metal layer is copper foil (Example 5 and Comparative Example 2) and the cases where the metal layer is not a copper foil (Comparative Example 1), and this difference becomes conspicuous as the frequency increases. Furthermore, at 6 GHz (6000 MHz), the attenuation amount in Comparative Example 1 is on a similar level as the attenuation amount in Comparative Example 2 employing an isotropic conductive adhesive, but the attenuation amount is small in Example 5 employing an anisotropic conductive adhesive. As such, when the shield film of the present invention is used in a signal transmission system for transmitting a signal with a frequency of 10 MHz to 10 GHz, electric field waves, magnetic field waves and electromagnetic waves progressing from one side to the other side of the shield film are suitably shielded.

<Output Wave Characteristics>

Figure 7:
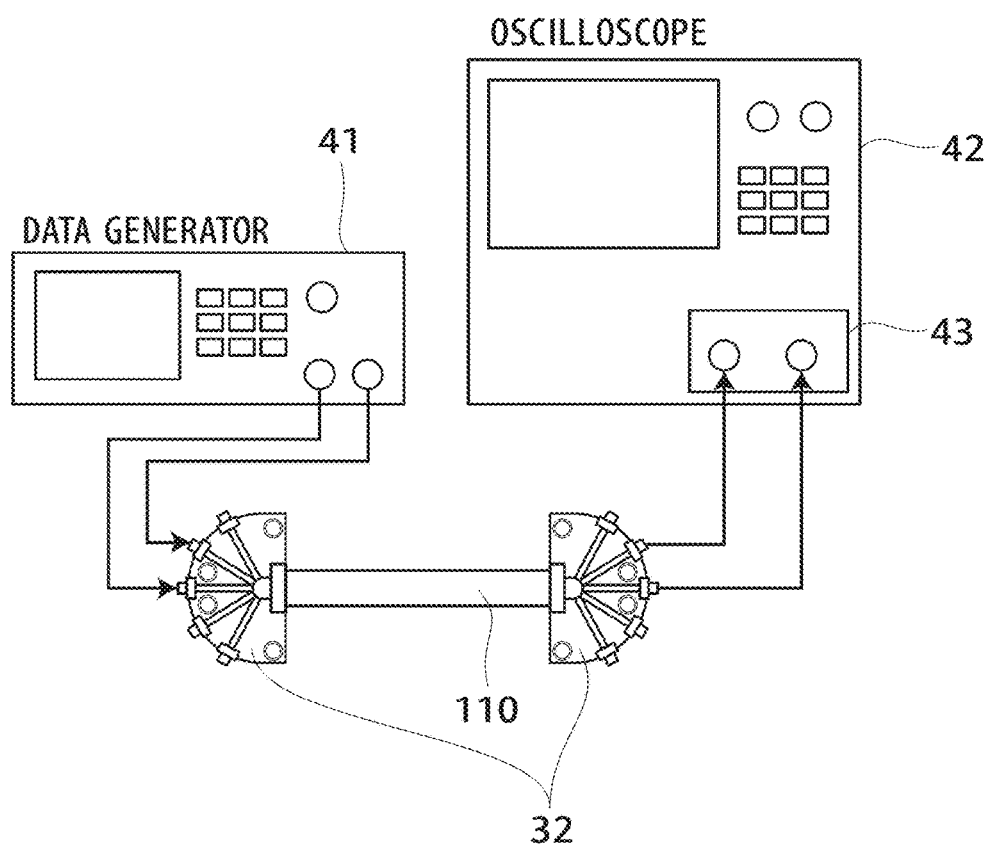
FIG. 7 is a system configuration diagram of a system for measuring output wave characteristics.

The output wave characteristics of the shield film were evaluated using a system configuration shown in FIG. 7. The system was constituted by a data generator 41, an oscilloscope 42, a sampling module 43 attached to the oscilloscope 42, and a pair of connection boards 32.

As the data generator 41, 81133A made by Agilent Technologies was used. As the oscilloscope 42, DSC8200 made by Tektronix, Inc. was used. As the sampling module 43, 80E03 made by Tektronix, Inc. was used.

As shown in FIG. 7, each connection board 32 includes an input terminal and an output terminal, and between the pair of connection boards 32, a shield flexible printed wiring board 110 which is the measurement target is connected so as to linearly float in the air, and the data generator 41 is connected with the sampling module 43. The eye pattern was measured in this state.

Furthermore, the measurement was done using a device similar to the shielded printed wiring board 110 used for measuring the frequency characteristics. The input amplitude was set at 150 mV/side (300 mVdiff). The data pattern was PRBS23. The measurement was done at a temperature of 25 degrees centigrade and in a relative moisture of 30 to 50 percent.

Figure 8A:
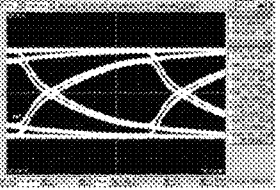
FIG. 8(a) shows results of measurement of the output wave characteristics when the bit rate is 1.0 Gbps.
Figure 8B:
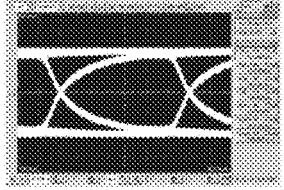
FIG. 8(b) shows results of measurement of the output wave characteristics when the bit rate is 3.0 Gbps.

Measurement results by the oscilloscope 42 at the bit rate of 1.0 Gbps are shown in FIG. 8(a), and measurement results by the oscilloscope 42 at the bit rate of 3.0 Gbps are shown in FIG. 8(b). According to the results, at any bit rate and both in one-sided shielding and in double-sided shielding, jitter was frequency observed in the eye pattern of Comparative Examples 1 and 2 as compared to Example 5. This indicates that Example 5 is suitable for high-speed processing.

<Shape Retaining Property>

The shape retaining property of the shield film was evaluated. In this connection, a sample 51 was formed by attaching the shield film 101 shown in Table 1 to each of the both surfaces of a polyimide film 50 μm thick. The sample 51 was sized 10 mm×100 mm.

Figure 9:
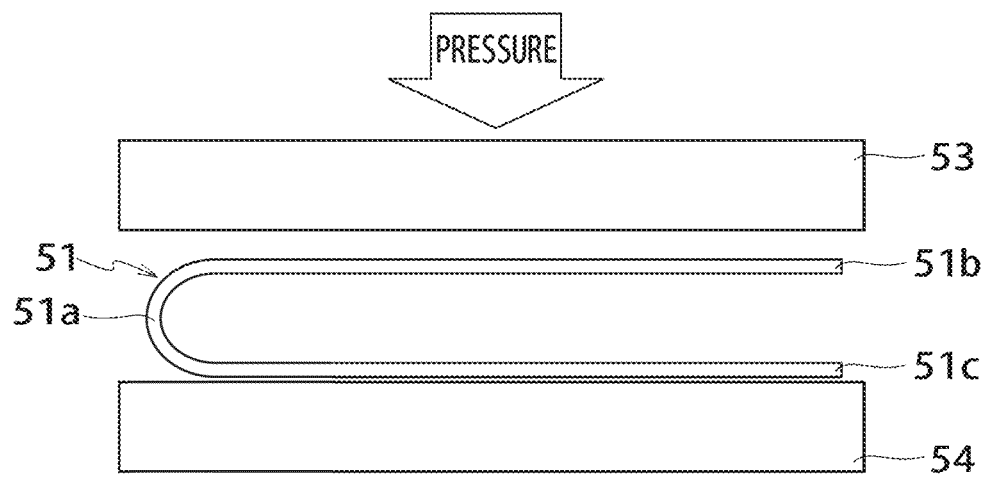
FIG. 9 shows an experimental apparatus for measuring a shape retaining property.

As shown in FIG. 9, such a sample 51 was folded at a folding part 51a at around the longitudinal center (around 50 mm) so that a fold is slightly formed, and an upper part 51b above the folding part 51a opposed to a lower part 51c below the folding part 51a.

The entirety of the sample 51 was placed on a PP (polypropylene) substrate 54, and SUS plates (not illustrated) each 0.3 mm thick were provided on the both sides of the sample 51 as spacers, to be in parallel to the length of the sample 51. In this state, silicon rubber 53 was lowered from above and the entirety of the sample 51 was pressed together with the SUS plates. Because of the presence of the SUS plates each 0.3 mm thick, the bend radius of the sample 51 was 0.15 mm at the folding part 51a. Both when the pressing force in the pressing was 0.1 MPa and when the pressing force was 0.3 MPa, the pressing time was set at one second, three seconds, or five seconds, and the angle (return angle) formed by the upper part 51b and the lower part 51c in the sample 51 after the pressing was measured.

In Table 3 below, the return angles measured in Examples 1 to 5 and Comparative Examples 1 and 2 are shown. In regard to the evaluation, in case of double-sided shielding, an evaluation result was "Good" when the angle was 90 degrees or smaller, whereas an evaluation result was "Bad" when the angle was 120 degrees or larger. According to Table 3, the shape retaining property was good in rolled copper foil. This indicates that rolled copper foil is suitable in terms of the shape retaining property.

<Sliding Characteristic>

Figure 10:
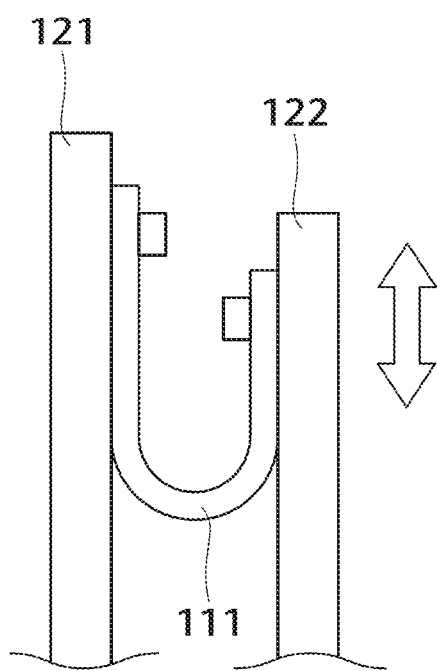
FIG. 10 shows an experimental apparatus for measuring a sliding characteristic based on the IPC standard.

Under the IPC standard, as shown in FIG. 10, a shield flexible printed wiring board 111 (formed by using a sample of one of Examples 1 to 5 and Comparative Examples 1 and 2) was bended to form a U-shape with the curvature at 0.65 mm and was provided between a fixing plate 121 and a sliding plate 122 that were distanced from each other by 1.30 mm, and under a test atmosphere of 25 degrees centigrade in temperature and 30 to 50 percent in relative moisture, the endurance of the metal layer of the shield film in the shield flexible printed wiring board (i.e., how many times the sliding must be done to deteriorate the layer) was measured when the sliding plate 122 was vertically slid with the stroke length of 50 mm (sliding area of 25 mm) and at the sliding speed of 60 cpm. Each shield film was 140 mm long. Measurement results of Examples 1 to 5 and Comparative Examples 1 and 2 are shown in Table 3 below, together with the shape retaining properties.

Also in Table 3, measurement results regarding the above-described frequency characteristics and shielding characteristics of Examples 1 to 5 and Comparative Examples 1 and 2 are shown. In regard to the frequency characteristics, frequencies when the attenuation is at −3 dB and at −10 dB are shown. In regard to the shielding characteristics, an attenuation amount with respect to an electric field wave of 1 GHz is shown.

manufacturing the shielded printed wiring board 10 was measured (measurement of connection resistance after reflow). More specifically, as shown in Table 4, in Example 6, the copper foil was not treated with rust prevention, and the connection resistance ($\Omega$) between the shield film 1 and the ground circuit 6b was measured using the shielded printed wiring board 10 in which a protective metal layer 3a formed by vacuum-depositing silver to be 0.05 μm thick was provided between the metal layer 3 and the anisotropic conductive adhesive layer 4 of the shield film 1. In Example 7, the copper foil was not treated with rust prevention, and the connection resistance ($\Omega$) between the shield film 1 and the ground circuit 6b was measured using the shielded printed wiring board 10 in which a protective metal layer 3a formed by vacuum-depositing silver to be 0.1 μm thick was provided between the metal layer 3 and the anisotropic

TABLE 3

| TYPE | ITEM | EXAMPLE 1 | EXAMPLE 2 | EXAMPLE 3 | EXAMPLE 4 | EXAMPLE 5 | COMPARATIVE EXAMPLE 1 | COMPARATIVE EXAMPLE 2 |
|---|---|---|---|---|---|---|---|---|
| EVALUATION | FREQUENCY CHARACTERISTICS(MHz) [@~3 dB/@~10 dB] | 500 3500 | 530 3600 | 550 3660 | 550 3660 | 560 3660 | 220 760 | 430 1890 |
| | SHIELDING CHARACTERISTICS(dB) [1 GHz] | 74 | 80 | 86 | 90 | 96 | 60 | 96 |
| | SLIDING CHARACTERISTIC(times) R0.65 | 500,000 | 400,000 | 300,000 | 50,000 | 200 | 400,000 | 200 |
| | SHAPE RETAINING PROPERTY | GOOD | GOOD | GOOD | GOOD | GOOD | BAD | GOOD |

According to the results shown in Table 3, in regard to high-speed transmission, for the same attenuation value, the frequency was high in the case of the anisotropic conductive adhesive. This indicates that the attenuation did not occur even at a high frequency, and hence the use of the anisotropic conductive adhesive was clearly suitable for the high-speed processing.

In regard to the shielding characteristics, the shielding characteristics were good when the thickness of the metal layer was 0.5 μm or more.

It is therefore concluded that a shield film which is suitable for high-speed processing while maintaining shielding characteristics is realized when the metal layer is at least 0.5 μm thick and the anisotropic conductive adhesive is used therein.

The sliding characteristic was significantly deteriorated when the thickness of the metal layer was 5 μm or more. Therefore, when importance is given to the sliding characteristic, it is clearly preferable that the thickness of the metal layer is 5 μm or less.

In regard to the shape retaining property, good shape retaining property was obtained when the metal layer was a copper foil and formed by rolling. Therefore, when importance is given to the shape retaining property, rolled copper foil is clearly preferred.

<Connection Resistance>

The connection resistance between the shield film and the shielded printed wiring board after the manufacturing step of conductive adhesive layer 4 of the shield film 1. In Example 8, the copper foil was not treated with rust prevention, and the connection resistance ($\Omega$) between the shield film 1 and the ground circuit 6b was measured using the shielded printed wiring board 10 in which a protective metal layer 3a formed by plating silver to be 0.05 μm thick was provided between the metal layer 3 and the anisotropic conductive adhesive layer 4 of the shield film 1. In Example 9, the copper foil was not treated with rust prevention, and the connection resistance ($\Omega$) between the shield film 1 and the ground circuit 6b was measured using the shielded printed wiring board 10 in which a protective metal layer 3a formed by plating silver to be 0.1 μm thick was provided between the metal layer 3 and the anisotropic conductive adhesive layer 4 of the shield film 1. In Example 5, the copper foil was treated with rust prevention, and the connection resistance ($\Omega$) between the shield film 1 and the ground circuit 6b was measured in a shielded printed wiring board not including a protective metal layer 3a. Each of the shield films 1 in Examples 5 to 9 was arranged such that the insulating layer 2 was 5 μm thick, the metal layer 3 (rolled copper foil) was 6 μm thick, and the anisotropic conductive adhesive layer 4 was 3 μm thick. Each of the shield films 1 of Examples 6 to 9 was arranged such that the protective metal layer 3a was further provided between the metal layer 3 and the anisotropic conductive adhesive layer 4.

TABLE 4

|  |  | EXAMPLE5 | EXAMPLE6 | EXAMPLE7 | EXAMPLE8 | EXAMPLE9 |
|---|---|---|---|---|---|---|
| TREATMENT OF COPPER FOIL | | RUST PREVENTION | NONE | NONE | NONE | NONE |
| PROTECTIVE METAL LAYER | TYPE | NONE | SILVER | SILVER | SILVER | SILVER |
| | THICKNESS(μm) | NONE | 0.05 | 0.1 | 0.05 | 0.1 |
| | METHOD | NONE | VAPOR DEPOSITION | VAPOR DEPOSITION | PLATING | PLATING |
| CONNECTION RESISTANCE(Ω) | | 1.45 | 0.52 | 0.36 | 0.03 | 0.02 |

According to the measurement results in Table 4, the connection resistance in Example 5 was endurable to practical use as it was 2Ω or lower, but the connection resistance was further reduced when the protective metal layer 3a was provided as in Examples 6 to 9. Furthermore, comparing Example 6 with Example 8 and comparing Example 7 with Example 9, the connection resistance was low when the protective metal layer 3a was formed by plating as compared to cases where the layer 3a was formed by vacuum deposition. Furthermore, comparing Example 6 with Example 8 and comparing Example 7 with Example 9, the connection resistance was low when the protective metal layer 3a was thick.

REFERENCE SIGNS LIST 1 shield film
2 insulating layer
3 metal layer
4 anisotropic conductive adhesive layer
5 basic film
6 printed circuit
6a signal circuit
6b ground circuit
6c non-insulating part
7 insulating film
7a insulation removal part
8 base film
10 shielded printed wiring board

The invention claimed is:

1. A shield film suitable for use in shielding a signal-transmitting circuit from signal-interfering electromagnetic noise, comprising:
a metal layer, which is 2 μm to 12 μm thick;
an insulating layer, which is 1 μm to 10 μm thick and is disposed along and in contact with a first surface of the metal layer; and
an anisotropic conductive adhesive layer containing conductive filler with an average particle size of 2 μm to 20 μm, which anisotropic conductive adhesive layer is disposed along and in contact with a second, opposite surface of the metal layer;
wherein the shield film exhibits between 74 dB and 96 dB of attenuation of an electric field wave at 1 GHz, as measured using KEC method.

2. The shield film according to claim 1, wherein the metal layer is metal foil.

3. The shield film according to claim 2, wherein the metal foil has been formed by rolling.

4. The shield film according to claim 3, wherein the thickness of the metal foil has been adjusted by etching.

5. The shield film according to claim 4, wherein the metal foil is mainly made of copper.

6. The shield film according to claim 1, wherein the metal layer has been formed by an additive process.

7. The shield film according to claim 6, wherein as the additive process, the metal layer has been formed by at least one of electroplating and electrodeless plating.

8. The shield film according to claim 1, wherein the shield film is configured to function as an electromagnetic waves shield film of a signal transmission system transmitting a signal with a frequency of 10 MHz to 10 GHz.

9. A shielded printed wiring board, comprising:
a printed wiring board including a base member in which a printed circuit is formed and an insulating film provided on the base member so as to cover the printed circuit; and
a shield film according to claim 1 provided on the printed wiring board.

10. The shielded printed wiring board according to claim 9, wherein the printed circuit includes a ground wiring pattern.

11. The shield film according to claim 1, wherein the metal layer is mainly made of copper and includes a protective metal layer that is made of silver or gold.

12. The shield film according to claim 11, wherein the anisotropic conductive adhesive layer is disposed in contact with the protective metal layer.

13. A shield film suitable for use in shielding a signal-transmitting circuit from signal-interfering electromagnetic noise, comprising:
a metal layer, which is 2 μum to 12 μm thick;
an insulating layer, which is 1 μm to 10 μm thick and is disposed along and in contact with a first surface of the metal layer; and
an anisotropic conductive adhesive layer containing conductive filler with an average particle size of 2 μm to 20 μm, which anisotropic conductive adhesive layer is disposed along and in contact with a second, opposite surface of the metal layer;
wherein the shield film exhibits between about 70 dB and about 85 dB of attenuation of a magnetic field wave at 1 GHz, as measured using KEC method.

* * * * *